(12) United States Patent
Porter

(10) Patent No.: US 10,320,193 B2
(45) Date of Patent: Jun. 11, 2019

(54) ELECTRICAL SYSTEMS AND RELATED ISLANDING DETECTION METHODS

(71) Applicant: S&C Electric Company, Chicago, IL (US)

(72) Inventor: David Glenn Porter, East Troy, WI (US)

(73) Assignee: S&C Electric Company, Chicago, IL (US)

( * ) Notice: Subject to any disclaimer, the term of this patent is extended or adjusted under 35 U.S.C. 154(b) by 273 days.

(21) Appl. No.: 15/381,913

(22) Filed: Dec. 16, 2016

(65) Prior Publication Data

US 2017/0179720 A1 Jun. 22, 2017

Related U.S. Application Data

(60) Provisional application No. 62/269,437, filed on Dec. 18, 2015.

(51) Int. Cl.
*H02J 1/00* (2006.01)
*H02J 3/00* (2006.01)
(Continued)

(52) U.S. Cl.
CPC ............... *H02J 3/16* (2013.01); *G01R 23/02* (2013.01); *H02J 3/382* (2013.01); *H02J 2003/388* (2013.01); *Y02E 40/34* (2013.01)

(58) Field of Classification Search
CPC ... G01R 23/02; H02J 3/16; H02J 3/382; H02J 2003/388; Y02E 40/34
(Continued)

(56) References Cited

U.S. PATENT DOCUMENTS 5,798,633 A 8/1998 Larsen et al.
7,840,313 B2 11/2010 Horio et al.
(Continued)

FOREIGN PATENT DOCUMENTS

WO 2012106389 A2 8/2012

OTHER PUBLICATIONS

United States International Searching Authority, International Search Report and Written Opinion for International Application No. PCT/US16/67283 dated Apr. 28, 2017.
(Continued)

*Primary Examiner* — Rexford N Barnie
*Assistant Examiner* — Toan T Vu

(57) ABSTRACT

Electrical systems and related operating methods are provided. One exemplary electrical system includes a sensing arrangement coupled to an electrical grid interface to measure an electrical characteristic of the electrical grid interface, a power conversion module having an output coupled to the electrical grid interface, and a control module coupled to the sensing arrangement and the power conversion module. The control module determines an estimated frequency of the electrical characteristic based on a measured value of the electrical characteristic from the sensing arrangement, adjusts a commanded reactive power for the power conversion module to increase a difference between the estimated frequency and a reference frequency, operates the power conversion module in accordance with the adjusted reactive power command, and thereafter initiates a remedial action when the difference between the estimated frequency and the reference frequency exceeds a threshold amount.

17 Claims, 4 Drawing Sheets

(51) Int. Cl.
    *H02J 3/16*     (2006.01)
    *G01R 23/02*     (2006.01)
    *H02J 3/38*     (2006.01)

(58) Field of Classification Search
    USPC .......................................................... 307/86
    See application file for complete search history.

(56) References Cited

U.S. PATENT DOCUMENTS

| | | |
|---|---|---|
| 8,159,178 B2 | 4/2012 | Serban |
| 2001/0056330 A1 | 12/2001 | Wills |
| 2010/0138070 A1 | 6/2010 | Beaudoin |
| 2011/0115301 A1 | 5/2011 | Bhavaraju et al. |
| 2014/0200722 A1 | 7/2014 | Bhavaraju |
| 2014/0265596 A1 | 9/2014 | Yuan et al. |
| 2015/0249416 A1 | 9/2015 | Barker |
| 2016/0211743 A1* | 7/2016 | Harrison ............... H02J 3/1835 |

OTHER PUBLICATIONS

The International Bureau of WIPO, International Preliminary Report on Patentability for International Application No. PCT/US2016/067291 dated Jun. 28, 2018.

Steven W. Blume, Electric Power System Basics for the Nonelectrical Professional, IEEE Press Series of Power Engineering, pp. 186-201, Institute of Electrical and Electronics Engineers, Inc., 2007, John Wiley & Sons, Inc., Hoboken, New Jersey, USA.

United States International Searching Authority, International Search Report and Written Opinion for International Application No. PCT/US2016/067291 dated Mar. 9, 2017.

\* cited by examiner

ELECTRICAL SYSTEMS AND RELATED ISLANDING DETECTION METHODS

CROSS-REFERENCE TO RELATED APPLICATION(S)

This application claims the benefit of U.S. Provisional Patent Application Ser. No. 62/269,437, filed Dec. 18, 2015, the entire content of which is incorporated by reference herein.

TECHNICAL FIELD

The subject matter described herein relates generally to electrical systems, and more particularly, to detecting unintentional islanding of a microgrid system from an electrical grid.

BACKGROUND

Advances in technology have led to substantial changes to electrical distribution systems as they evolve towards a so-called "smart grid" that supports distributed energy generation from solar, wind, and other distributed energy sources in a resilient and adaptive manner. One such advancement is the deployment of localized electrical systems or "microgrids," which are capable of disconnecting from a larger utility grid (or backbone grid) and operating autonomously, alternatively referred to as "islanding." In many instances, these microgrid systems may also include local energy sources, which can be utilized to augment the utility grid.

In practice, a microgrid system can experience what is commonly referred to as unintentional islanding, where the local area of the utility grid has been de-energized by the utility or other third-party. For example, one or more switches upstream of the microgrid system (e.g., at a substation) may be opened for maintenance or safety reasons. Often, applicable safety protocols and standards require that the microgrid system detect an unintentional islanding and cease any energization of the local portion of the utility grid. Existing detection techniques are susceptible to false island detection (e.g., detecting islanding when it does not exist). Additionally, they may fail to detect islanding conditions when they do exist, for example, when any error signal component attributable to the islanding is still within the normal operating range for the utility, making it appear that the grid is still being energized by the utility. Accordingly, it is desirable to provide systems and methods capable of reliably and consistently detecting unintentional islanding as quickly as possible and with a reduced likelihood of false positives. Furthermore, other desirable features and characteristics of the present invention will become apparent from the subsequent detailed description and the appended claims, taken in conjunction with the accompanying drawings and the foregoing technical field and background.

BRIEF SUMMARY

Electrical systems and related operating methods are provided. An exemplary electrical system includes a sensing arrangement coupled to an electrical grid interface to measure an electrical characteristic of the electrical grid interface, a power conversion module having an output coupled to the electrical grid interface, and a control module coupled to the sensing arrangement and the power conversion module. The control module determines an estimated frequency of the electrical characteristic based on a measured value of the electrical characteristic from the sensing arrangement, adjusts a commanded reactive power for the power conversion module to increase a difference between the estimated frequency and a reference frequency, and operates the power conversion module in accordance with the adjusted reactive power command. Thereafter, the control module initiates a remedial action when the difference between the estimated frequency and the reference frequency exceeds a threshold amount. In this regard, the adjusted reactive power command effectuates positive feedback that, when the system is unintentionally islanded, increases a difference between the frequency at the grid interface and the reference frequency and drives the frequency to violate applicable limits or thresholds, thereby triggering a remedial action.

In another embodiment, an electrical system includes one or more voltage sensing arrangements coupled to the electrical grid interface node to obtain a recent measurement of a voltage at the electrical grid interface node and an energy storage system. The energy storage system includes a battery, an inverter module coupled between the battery and the electrical grid interface node, and a control module coupled to the one or more voltage sensing arrangements and the inverter module. The control module determines an estimated frequency of the voltage at the electrical grid interface node based on the recent voltage measurement, operates the inverter module to adjust reactive power flow at the output of the inverter module in a manner that is configured to increase a difference between the estimated frequency and a reference frequency, and initiates a remedial action when the estimated frequency violates a frequency threshold. The adjusted reactive power flow increases the difference between the frequency at grid interface and the reference frequency when the grid interface is not being powered from a relatively strong frequency source, such as an electrical utility.

An embodiment of a method of operating an electrical system to detect an islanding condition is also provided. The method involves obtaining a measurement of an electrical characteristic at the interface with an electrical grid from one or more sensing arrangement coupled to the interface, determining an estimated frequency of the electrical characteristic based on the measurement, operating a power conversion module coupled between the interface and an energy storage element in a manner configured to increase a difference between the estimated frequency and a reference frequency, and detecting the islanding condition when the estimated frequency violates a frequency threshold.

BRIEF DESCRIPTION OF THE DRAWINGS

Embodiments of the subject matter will hereinafter be described in conjunction with the following drawing figures, wherein like numerals denote like elements, and wherein:

FIG. 4 is a block diagram of an exemplary power control system suitable for a current-source operating mode in

DETAILED DESCRIPTION

Figure 1:
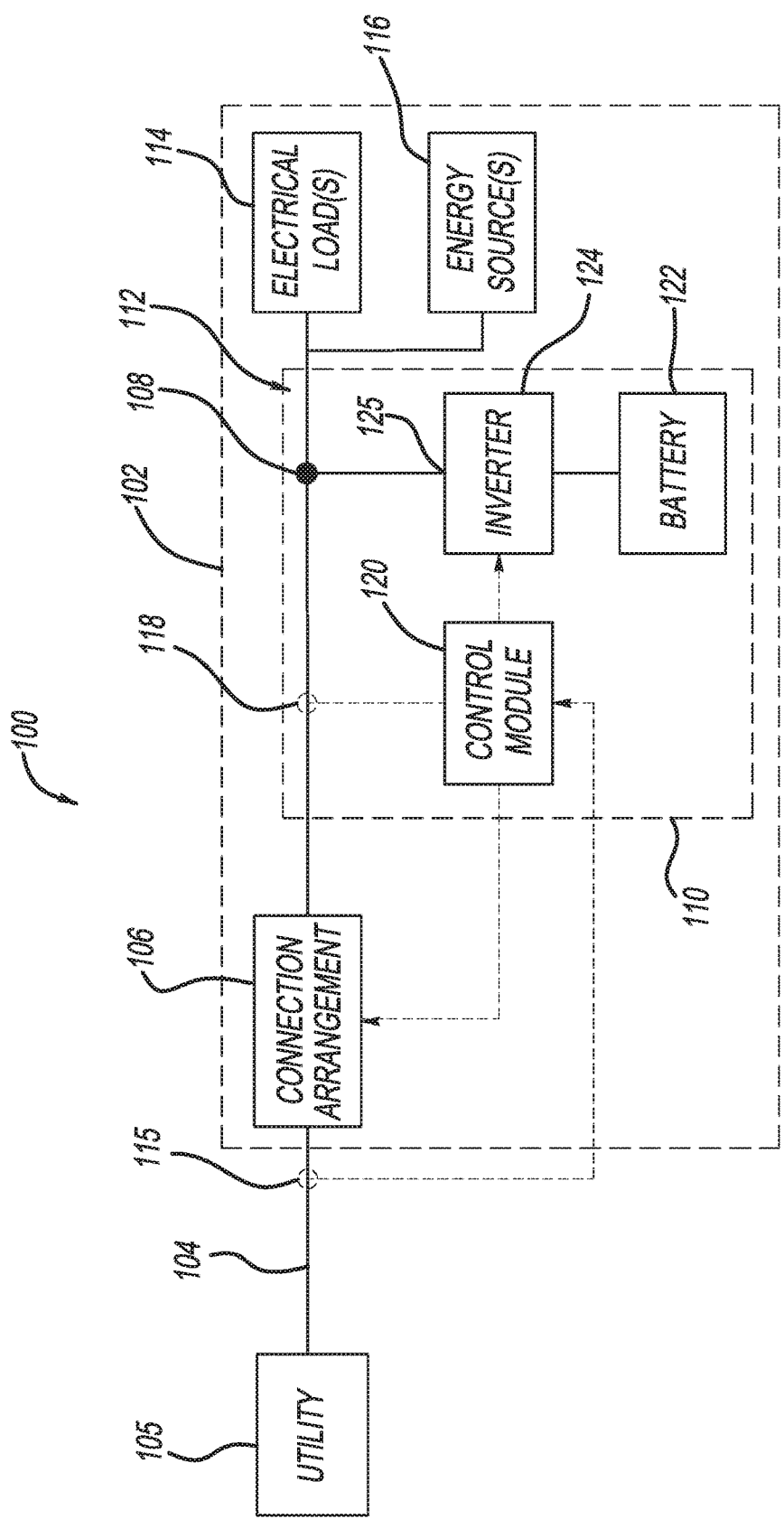
FIG. 1 is a schematic view of an electrical distribution system in one or more exemplary embodiments.

Embodiments of the subject matter described herein relate to electrical systems capable of detecting an unintentional islanding condition based on the frequency at an interface with an external electrical grid. In exemplary embodiments, a power conversion module is operated in a manner configured to increase the difference between the current frequency at the interface and a reference frequency (e.g., a nominal or target frequency), and detects an islanding condition when the frequency at the grid interface violates a frequency threshold. In this regard, rather than attempting to regulate the frequency by reducing the difference, the power conversion module is operated to introduce additional frequency error, which, in turn, may be corrected by the frequency regulation provided by the electrical grid when the electrical system is not in an islanded state. Conversely, when electrical system is islanded, operating the power conversion module to increase the difference between the current frequency at the interface and the reference frequency will drive the interface frequency to violate either a minimum or maximum frequency threshold. In this regard, when the interface frequency exceeds a threshold indicative of an islanding condition, the electrical system may be automatically disconnected from the external electrical grid to prevent energizing the electrical grid.

Exemplary embodiments described herein utilize an energy storage system that includes an energy storage element, such as a battery, that is coupled to the grid interface via a unidirectional or bidirectional power conversion module, such as a power inverter. A control module determines an estimate of the frequency of an electrical characteristic at the grid interface (e.g., the grid voltage) and operates the power conversion module to adjust reactive power flow to/from the power conversion module in a manner that increases the difference between the estimate of the current grid frequency and a reference frequency (e.g., a 60 Hz nominal frequency). In this regard, the control module operates the power conversion module to consume additional reactive power (e.g., by supplying reactive power (or VARs) or looking more capacitive) when the estimated frequency is greater than the reference frequency, and alternatively, operates the power conversion module to supply additional reactive power (e.g., by consuming VARs or looking more inductive) when the estimated frequency is less than the reference frequency. In one or more exemplary embodiments, the control module determines an adjustment to the commanded reactive power flow for the power conversion module based on the difference between the estimated frequency and the reference frequency, and then further dithers or modulates the adjustment before applying the reactive power adjustment. In this regard, by modulating or dithering the reactive power adjustment in a deterministic manner, the islanding detection scheme also accounts for resonance at the reference frequency of the electrical grid, thereby reducing the likelihood of false negatives.

FIG. 1 depicts an exemplary embodiment of an electrical distribution system 100 that includes a microgrid electrical system 102 capable of being selectively connected to an external electrical grid 104 via a connection arrangement 106. The electrical grid 104 generally represents the distribution lines (or feeders), transformers, and other electrical components that provide an electrical interconnection between the microgrid system 102 and one or more external electrical power source(s) 105, which may be provided, for example, by a public utility. Accordingly, for purposes of explanation but without limitation, the electrical power source(s) 105 external to the microgrid system 102 may alternatively be referred to herein as the "utility" and the electrical grid 104 may alternatively be referred to herein as the "utility grid;" however, the subject matter is not limited to traditional utility distribution systems, and in various embodiments, the electrical power source(s) 105 may include one or more additional microgrid systems, distributed energy sources, or the like. Additionally, for purposes of explanation but without limitation, "upstream" or variants thereof may be used herein with reference to locations on or along the electrical grid 104 outside of the microgrid system 102 on a first side of the connection arrangement 106, while "downstream" or variants thereof may be used herein with reference to locations within the microgrid system 102 on the opposite side of the connection arrangement 106.

It should be noted that FIG. 1 depicts a simplified representation of the electrical distribution system 100 for purposes of explanation and is not intended to be limiting. For example, in practice, both the electrical grid 104 and the microgrid system 102 may be realized as three-phase electric systems, with corresponding wiring, lines, and other electrical components to support three-phase operation. Thus, although individual elements, connecting lines, or the like may be depicted in FIG. 1, practical embodiments of the electrical distribution system 100 may include such elements in triplicate, as will be appreciated in the art. Additionally, it should be noted that although the subject matter may be described herein in the context of a microgrid system 102 connected to an electrical grid 104 via a connection arrangement 106, the subject matter described herein is not limited to use with microgrid systems 102 or systems that utilize a connection arrangement 106 to interface with the electrical grid 104.

The illustrated microgrid system 102 includes an energy storage or generation system 110 that is connected to the electrical grid 104 downstream of the connection arrangement 106 at an interface node 108 (or interconnect point) where electrical signals on the electrical grid 104 interfaces with electrical signals on the microgrid distribution arrangement 112. In this regard, the microgrid distribution arrangement 112 generally represents the buses, wiring, lines, and/or other electrical components capable of providing electrical interconnections between the electrical grid 104 and/or the energy storage system 110 to one or more electrical loads 114 and/or one or more electrical energy sources 116 within the microgrid system 102. The electrical loads 114 generally represent any devices, systems, components or appliances that receive electrical power from the microgrid distribution arrangement 112 for operation, such as, for example, one or more computer systems or other computing equipment (e.g., computers, servers, databases, networking components, or the like), medical equipment or devices, household appliances, or the like. The energy sources 116 generally represent any devices, systems, or components capable of generating electrical power that may be provided back out to the microgrid distribution arrangement 112, for example, to support operations of the electrical load(s) 114 or to deliver electrical power back to the grid 104. The energy sources 116 may include, for example, one or more wind turbines, solar panels or other photovoltaic components, electrical generators, fuel cells, batteries, or the like, which are suitably configured to support the subject matter described herein.

In the illustrated embodiment, the energy storage system 110 includes a control module 120 configured to regulate power flow at the electrical grid interface 108, an energy storage element 122, and a power conversion module 124 coupled between the energy storage element 122 and the electrical grid interface 108. In exemplary embodiments, the energy storage element 122 is realized as a battery capable of receiving electrical energy from the electrical grid interface 108 via the power conversion module 124 and storing the received electrical energy; accordingly, for purposes of explanation and without limitation, the energy storage element 122 is alternatively referred to herein as a battery. Additionally, the battery 122 may provide electrical energy to the electrical grid interface 108 via the power conversion module 124. In this regard, the power conversion module 124 supports bidirectional flow of electrical current to/from the electrical grid interface 108.

In exemplary embodiments, the power conversion module 124 is realized as a bidirectional three-phase full bridge inverter capable of rectifying three-phase alternating current (AC) electrical signals at the electrical grid interface 108 to a direct current (DC) signal provided to the battery 122 when the battery 122 is receiving electrical energy from the electrical grid interface 108 (or charging). Conversely, the inverter is also capable of converting DC input signals from the battery 122 into corresponding three-phase AC output signals at the electrical grid interface 108 when the battery 122 is providing electrical energy to the electrical grid interface 108 (or discharging). For purposes of explanation and without limitation, the power conversion module 124 is alternatively referred to herein as an inverter or inverter module. As described in greater detail below, the control module 120 is coupled to the inverter 124 and operates the switching elements or other actuatable components of the inverter 124 to achieve so-called "four quadrant" operation and regulate both the real and reactive power flow at the electrical grid interface 108. It should be noted that although the subject matter may be described herein in the context of an interface 125 of the power conversion module 124 referred to herein as the output for purposes of explanation, depending on the embodiment and particular quadrant of operation for a bidirectional power conversion module 124, current may flow into the power conversion module 124 at the so-called output 125. Accordingly, the term output is not intended to impose any constraint on the power flow at the interface 125 of the power conversion module 124.

The control module 120 generally represents the hardware, circuitry, processing logic, and/or other electronic components configured to control operation of the inverter 124 to regulate the power flow to/from the microgrid system 102 and support detecting unintentional islanding of the microgrid system 102, as described in greater detail below. Depending on the embodiment, the control module 120 may be implemented or realized with a processor, a controller, a microprocessor, a microcontroller, a content addressable memory, a digital signal processor, an application specific integrated circuit, a field programmable gate array, any suitable programmable logic device, discrete gate or transistor logic, processing core, discrete hardware components, or any combination thereof, and configured to carry out the functions, techniques, and processing tasks associated with the operation of the microgrid system 102 described in greater detail below. Furthermore, the steps of a method or algorithm described in connection with the embodiments disclosed herein may be embodied directly in hardware, in firmware, in a software module executed by the control module 120, or in any practical combination thereof. In accordance with one or more embodiments, the control module 120 includes or otherwise accesses a data storage element, such as a memory (e.g., RAM memory, ROM memory, flash memory, registers, a hard disk, or the like) or another suitable non-transitory short or long term storage media capable of storing computer-executable programming instructions or other data for execution that, when read and executed by the control module 120, cause the control module 120 to execute, facilitate, or perform one or more of the processes, tasks, operations, and/or functions described herein.

Still referring to FIG. 1, the connection arrangement 106 generally represents one or more switching elements configured to electrically isolate the electrical grid 104 from the microgrid system 102 (e.g., the electrical grid interface 108 and/or the microgrid distribution arrangement 112) under control of the control module 120. In exemplary embodiments, the impedance of the connection arrangement 106 is substantially negligible such that the voltage and/or current of the electrical grid 104 immediately upstream of the connection arrangement 106 is substantially equal to the voltage and/or current of the electrical grid interface 108 downstream of the connection arrangement 106 when the switching elements are closed or otherwise activated to provide an electrical connection between the electrical grid 104 and the electrical grid interface 108. The connection arrangement 106 may include one or more relays, circuit breakers, fuses, or the like which are configured electrically in series between the electrical grid interface 108 and the electrical grid 104 and are electrically actuatable by the control module 120. Thus, in a disconnected or deactivated state, the connection arrangement 106 prevents current flow between the electrical grid 104 and the microgrid system 102, thereby islanding the microgrid system 102 relative to the utility 105. Accordingly, the connection arrangement 106 may alternatively be referred to as an Island Interconnect Device (IID).

The control module 120 is coupled to the electrical grid 104 via one or more sensing arrangements 115, 118 to detect or otherwise identify an electrical disturbance on the electrical grid 104 and automatically operate the connection arrangement 106 to disconnect the electrical grid interface 108 from the grid 104. In this regard, the sensing arrangements 115, 118 include one or more voltage sensors and/or current sensors configured to measure, sense, or otherwise quantify the respective electrical characteristic of a respective electrical phase and generate corresponding output signals provided to the control module 120. Upon the connection arrangement 106 effectively disconnecting the microgrid system 102 from the electrical grid 104, the control module 120 may operate the inverter 124 in a voltage-source control mode to emulate the utility 105 and support maintaining normal operation independent of the electrical grid 104 in an islanded state. In this regard, the energy storage system 110 may function as an uninterruptible power supply (UPS) when the microgrid system 102 is disconnected from the electrical grid 104. Additionally, in exemplary embodiments described herein, the control module 120 also detects or otherwise identifies an unintentional islanding condition, and in response to such an islanding condition, automatically operates the connection arrangement 106 to disconnect the electrical grid interface 108 from the grid 104. In alternative embodiments, in lieu of utilizing the connection arrangement 106 (or in embodiments that do not include a connection arrangement 106), in response to detecting an unintentional islanding condition, the control module 120 may automatically operate the power conversion module 124 to prevent power flow to the grid 104 (e.g., by opening all of the switches), thereby effectively disconnecting the battery 122 to prevent unintentional energizing of the grid 104.

Figure 2:
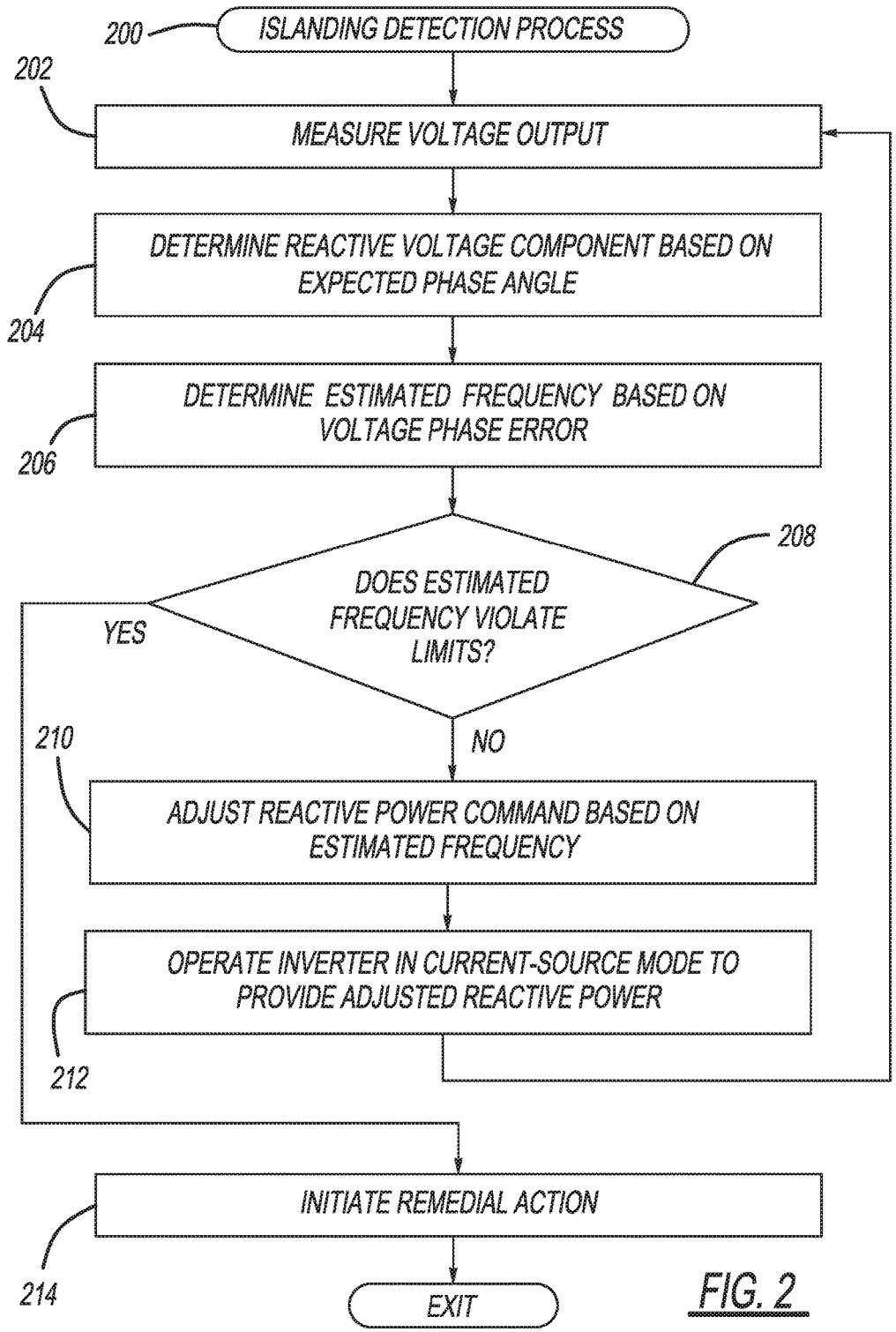
FIG. 2 is a flow diagram of a islanding detection process suitable for use with the electrical distribution system of FIG. 1 in an exemplary embodiment.

Referring now to FIG. 2, in an exemplary embodiment, the microgrid system 102 is configured to support an islanding detection process 200 and perform additional tasks, functions, and operations described below. The various tasks performed in connection with the illustrated process 200 may be implemented using hardware, firmware, software executed by processing circuitry, or any combination thereof. For illustrative purposes, the following description may refer to elements mentioned above in connection with FIG. 1. In practice, portions of the islanding detection process 200 may be performed by different elements of the microgrid system 102, such as, the control module 120, the battery 122, the inverter 124, the connection arrangement 106, and/or one or more of the sensing arrangements 115, 118. It should be appreciated that the islanding detection process 200 may include any number of additional or alternative tasks, the tasks need not be performed in the illustrated order and/or the tasks may be performed concurrently, and/or the islanding detection process 200 may be incorporated into a more comprehensive procedure or process having additional functionality not described in detail herein. Moreover, one or more of the tasks shown and described in the context of FIG. 2 could be omitted from a practical embodiment of the islanding detection process 200 as long as the intended overall functionality remains intact.

Referring now to FIG. 2, in the illustrated embodiment, the islanding detection process 200 receives or otherwise obtains a current measurement of the grid voltage and calculates or otherwise determines a phase error associated with the grid voltage based on the measured grid voltage (tasks 202, 204). In exemplary embodiments, the control module 120 measures the grid voltage by receiving or otherwise obtaining samples of the instantaneous voltage at the grid interface 108 from a voltage sensing arrangement 118. For example, for a three-phase utility grid 104, the control module 120 may obtain samples of the instantaneous voltages of the individual phases at the grid interface 108 from corresponding voltage sensors 118 associated with the respective phases. Thereafter, the control module 120 determines a phase error indicative of a difference between the measured grid voltage and an expected grid voltage, where the difference is attributable to the frequency of the grid voltage deviating from a reference frequency. Expressed another way, the phase error corresponds to the difference between a measured phase angle and an expected phase angle for the grid voltage. In exemplary embodiments, the reference frequency corresponds to a previously determined frequency of the electrical grid 104, which is also utilized by the control module 120 to match or lock the frequency of the voltage at the inverter output 125 to the grid voltage. Based on the phase error, the islanding detection process 200 calculates or otherwise determines an estimated frequency of the grid voltage (task 206).

Figure 3:
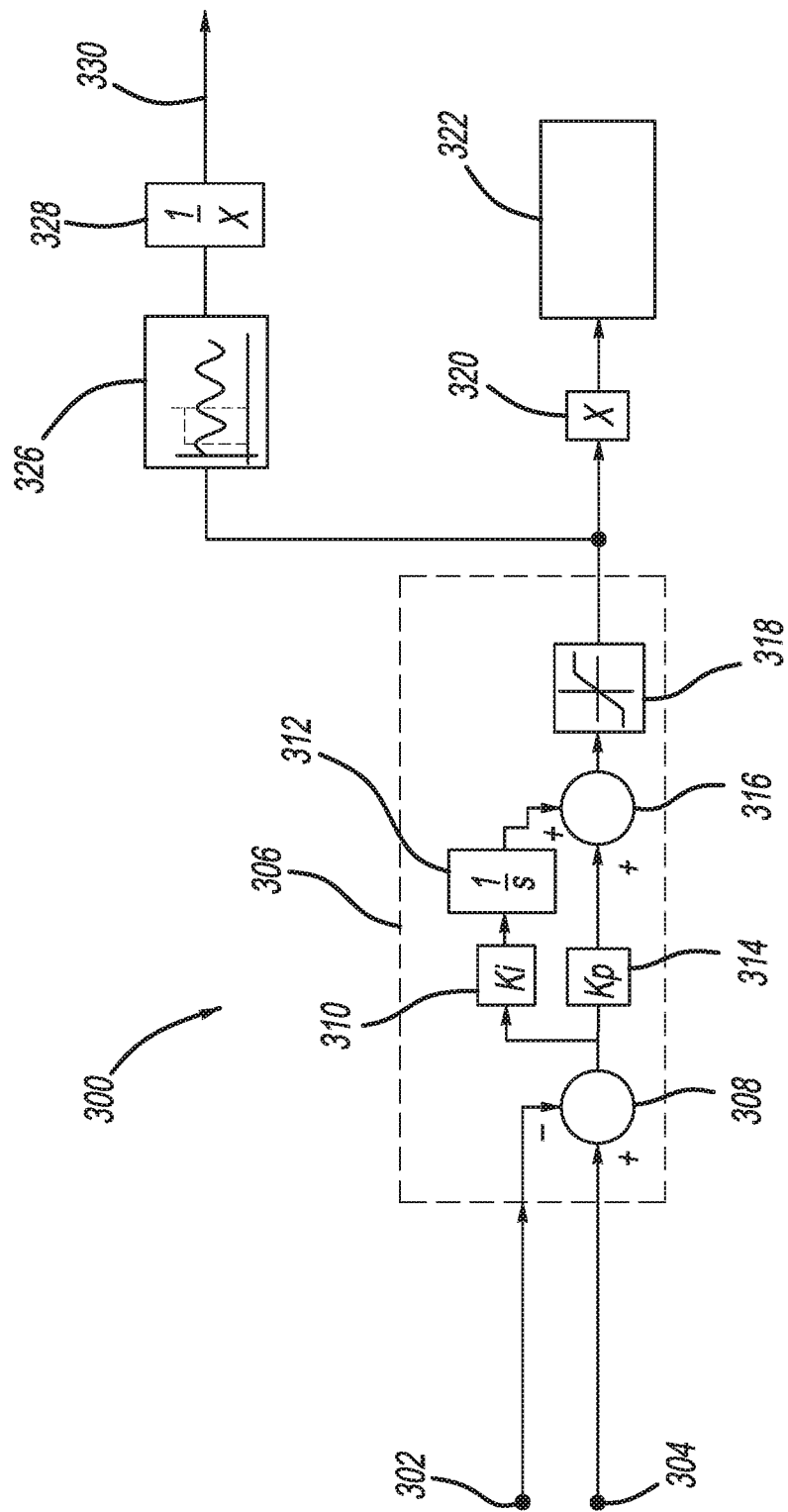
FIG. 3 is a block diagram of an exemplary phase-locked loop control system suitable for use with the islanding detection process of FIG. 2 in one or more exemplary embodiments.

Referring to FIG. 3, in exemplary embodiments, the control module 120 utilizes a phase-locked loop (PLL) control system 300 in a rotating reference frame to lock the inverter frequency to the frequency of the grid voltage. In this regard, the control module 120 performs a Clarke transformation to transform the instantaneous measured three-phase voltages to a two-phase stationary reference frame, performs a Park transformation to transform the two-phase voltages from the stationary reference frame to corresponding voltage measurement values in a rotating reference frame using a reference phase angle. The reference phase angle represents the expected position of the grid voltage at that particular sampling of the grid voltage. The Clarke transformation can be performed with the following equations:

$$V_{ds} = \frac{2}{3}V_{as} - \frac{1}{3}(V_{bs} + V_{cs}),$$

$$V_{qs} = \frac{1}{\sqrt{3}}(V_{bs} - V_{cs})$$

$$V_{os} = \frac{1}{3}(V_{as} + V_{bs} + V_{cs})$$

where $V_{as}$, $V_{bs}$, and $V_{cs}$ represent the instantaneous measured voltage values for the individual phases of the electrical grid 104. The Park transformation from the dqo reference frame can be performed with the following equations:

$$V_{dr} = V_{ds} \cos \theta + V_{qs} \sin \theta$$

$$V_{qr} = V_{qs} \cos \theta - V_{ds} \sin \theta$$

where $V_{dr}$ is the measured direct (or in-phase) voltage component, $V_{qr}$ is the measured quadrature (or out-of-phase) voltage component, and θ represents the reference phase angle for the expected position of the grid voltage. As described in greater detail below, the reference phase angle is dynamically updated or adjusted upon each iteration of the islanding detection process 200 to correspond to the estimated frequency (or period) of the grid voltage with respect to the sampling frequency. In exemplary embodiments, the reference phase angle is chosen to make the quadrature voltage component zero, so that any variations in the quadrature voltage component represent phase measurement error.

The quadrature voltage component value ($V_{qr}$) is then provided to the measured voltage input 302 to a proportional-integral (PI) regulation block 306 the PLL system 300 and subtracted from a reference quadrature voltage value at input 304 at summation block 308. In exemplary embodiments where the control module 120 attempts to maintain the inverter voltage output in lock with the grid voltage, the reference quadrature voltage value at input 304 is fixed at zero. The output of the summation block 308 is a phase error associated with the measured grid voltage which indicates a change in the frequency of the grid voltage that has caused the measured grid voltage to deviate from the expected position (i.e., the reference phase angle for the Park transformation).

The PI regulation block 306 includes an integral term path including an integral gain block 310 that multiplies the phase error by an integral gain coefficient, $K_I$, before an integration block 312 that produces an integral term that is combined at summation block 316 with a proportional term obtained by a proportional gain block 314 that multiplies the phase error by a proportional gain coefficient, $K_P$. The gain coefficients are chosen to convert the quadrature voltage phase error into a corresponding time period value required for the grid voltage to advance in the rotating reference frame by an angle corresponding to the sampling frequency of the control system 300. In this regard, the time period value represents a fractional period of an electrical cycle of the grid voltage corresponding to a ratio of the electrical cycle with respect to the sampling frequency (or update frequency) for the control system 300. For example, in exemplary embodiments, the control module 120 samples the sensing arrangements 118 at a rate of 4800 Hz, with the fractional time period output by the summation block 316 corresponding to the amount of time required for the grid voltage to advance in the rotating reference frame by $\frac{1}{80}^{th}$ of an electrical cycle (e.g., 4.5°), where $K_I$=0.00144 and $K_P$=0.0028.

Still referring to FIG. 3, the output of the PI regulation block 306 represents the amount of time for the grid voltage to advance in the rotating reference frame by the incremental angle corresponding to the sampling frequency of the control system 300 (e.g., $\frac{1}{80}^{th}$ of an electrical cycle for a 4800 Hz sampling frequency), which also represents the amount of time the control module 120 should wait before resampling the voltage sensing arrangements, 118. In this regard, the illustrated PI regulation block 306 includes a limiter block 318 configured to limit the fractional period (and thereby, the inverter frequency) to being within a fixed range of the nominal frequency (e.g., within +/−a threshold percentage or frequency of the nominal frequency). A gain block 320 converts the time for the incremental advancement in the rotating reference frame to a corresponding processor time in the processor clock time domain, which, in turn is then stored in or otherwise provided to a timer 322 that triggers the next sampling of the sensing arrangements 118 and the next iteration of the islanding detection process 200. In this regard, the next iteration of the islanding detection process 200 is performed after the time output by the PI regulation block 306 has elapsed since the preceding (or current) iteration. Upon the next iteration of the islanding detection process 200, the reference angle for the Park transform is also updated by the amount of incremental advancement in the rotating reference frame expected to occur during the time value output from the PI regulation block 306 (e.g., $\theta_i = \theta_{i-1} + 4.5°$ for a 4800 Hz sampling rate).

Still referring to FIG. 3, the control module 120 determines an estimated frequency for the grid voltage by inputting or otherwise providing the time period for the grid voltage to advance by the incremental angle to a sliding window filter block 326 that determines an estimated period of the grid voltage based on preceding outputs of the PI regulation block 306. For example, for an 4800 Hz sampling frequency, the sliding window filter block 326 may determine the estimated period by adding the current time value output by the PI regulation block 306 to the preceding 79 values, resulting in a running sum equal to the amount of time for the grid voltage to traverse the most recent electrical cycle (i.e., the estimated period of the most recent electrical cycle). That said, there are numerous different ways for determining the estimated period of the grid voltage, and the subject matter is not limited to any particular implementation. For example, the most recent time values corresponding to half of an electrical cycle (e.g., the preceding 40 iterations for a 4800 Hz sampling rate) can be summed and multiplied by two to obtain the estimated period of the grid voltage for an electrical cycle. The output of the sliding window filter block 326 is provided to an inverse determination block 328, which determines the inverse of the estimated period of the grid voltage, resulting in the estimated frequency (or measured frequency) of the grid voltage at output 330.

Referring again to FIG. 2, after determining the estimated frequency of the grid voltage, in exemplary embodiments, the islanding detection process 200 determines whether the estimated frequency is within a range of acceptable values for the electrical grid, and while the estimated frequency is within the range of acceptable values, the islanding detection process 200 continually adjusts or varies the reactive power flow to/from the power conversion module to modulate the grid frequency away from the nominal grid frequency if there is no strong frequency regulating source like a utility present (tasks 208, 210, 212). In this regard, when the microgrid system 102 is not unintentionally islanded and the utility 105 is supplying power to the local portion of the electrical grid 104, the frequency regulation provided by the utility 105 will counteract the reactive power flow at the electrical grid interface 108 and maintain a substantially stable grid frequency within the range of acceptable values. Conversely, when the local portion of the electrical grid 104 is not being supplied power (e.g., by virtue of an upstream switching arrangement being opened), the reactive power commands generated and implemented by the control module 120 continually drive the frequency of the voltage at the grid interface 108 away from the nominal frequency of the electrical grid 104 until the frequency of the voltage at the grid interface 108 is no longer within the range of acceptable values. In this regard, the loop defined by tasks 202, 204, 206, 208, 210 and 212 may repeat throughout operation of the microgrid system 102 to continually vary the reactive power flow from/to the energy storage system 110 until the estimated frequency of the voltage at the grid interface 108 is no longer within an acceptable range.

Figure 4:
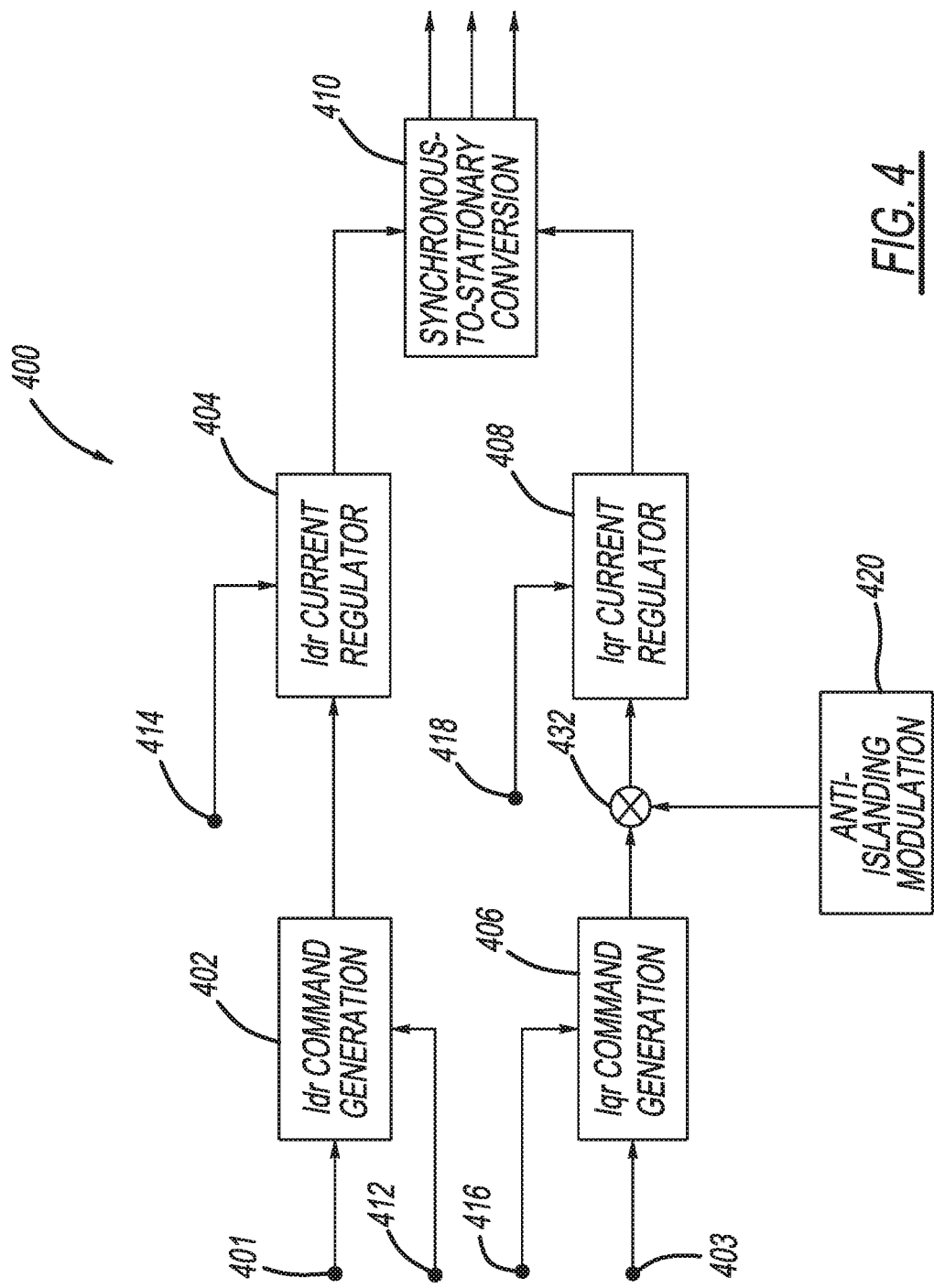

FIG. 4 depicts an exemplary embodiment of a power control system 400 that may be implemented by the control module 120 in conjunction with the islanding detection process 200 to operate the inverter 124 in a current-source operating mode and achieve a desired power flow to/from the battery 122 and/or inverter output 125 corresponding to a commanded real power at input 401 and a commanded reactive power at input 403. As described in greater detail below, the power control system 400 is configured to dynamically vary or adjust the reactive power flow based on the estimated frequency for purposes of detecting an unintentional islanding condition and automatically disconnecting the microgrid system 102 from the grid 104.

The power control system 400 includes a direct current command generation block 402 configured to generate or otherwise produce a direct current command based on a real power command received at input 401 and a recent direct voltage measurement received at input 412, for example, by converting the commanded real power to a commanded direct current by dividing the real power command at input 401 by the recent direct voltage measurement at input 412

$$\left(\text{e.g., } I_{dr\_commanded} = \frac{\text{Power}}{V_{dr}}\right).$$

During normal operation, the control module 120 calculates, determines, or otherwise generates the real power command at the input 401 based on one or more criteria, such as, for example, the power demands of the microgrid loads 114, the power generation of the microgrid energy sources 116, the current state of charge of the battery 122, and the like, either individually or in combination. The commanded direct current output by the direct current command generation block 402 is input to a direct current regulation block 404, which generates or otherwise determines a direct voltage command based on a difference between the commanded direct current and a measured direct current (e.g., obtained by performing Clarke and Park transformations on three-phase current measurements) provided at input 414. The output of the direct current regulator 404 is provided to a synchronous-to-stationary conversion block 410, which generates three-phase voltage commands utilized to control the respective phases of the inverter 124 and achieve a commanded power flow corresponding to the commanded direct voltage.

The power control system 400 also includes a quadrature current command generation block 406 configured to generate or otherwise produce a quadrature current command based on a reactive power command received at input 403 and a recent direct voltage measurement received at input 416, for example, by converting the commanded reactive power to a commanded quadrature current by dividing the reactive power command by the recent direct voltage measurement $$\left(\text{e.g., } I_{qr\_commanded} = \frac{\text{VAR}}{V_{dr}}\right).$$

In a similar manner as described above, during normal operation, the control module 120 calculates, determines, or otherwise generates the reactive power command at the input 403 based on one or more criteria. For example, depending on the embodiment, the reactive power command at the input 403 can be configured to maintain operation in-phase with the grid 104, control the power factor of the microgrid system 102 at node 108, or otherwise adjust the voltage or power factor locally at the grid interface 108 as desired. A quadrature current regulation block 408, which generates or otherwise determines a quadrature voltage command based on a difference between a commanded quadrature current and a measured direct current provided at input 418, and the quadrature voltage command the output of the quadrature current regulator 408 is provided to the synchronous-to-stationary conversion block 410. The synchronous-to-stationary conversion block 410 performs reverse Park and Clarke transformations on the direct voltage command from direct current regulator 404 and the quadrature voltage command from the quadrature current regulator 408 to obtain corresponding three-phase voltage commands utilized to control the respective phases of the inverter 124 and achieve the commanded real and reactive power flow.

Still referring to FIG. 4 with reference to FIGS. 1-3, the power control system 400 includes an anti-islanding modulation block 420 configured to dynamically generate a reactive power adjustment based on the measured frequency of the grid voltage, which, in turn, is added to the quadrature current command generated by the quadrature current command generation block 406 at summation block 422. In this regard, the reactive power adjustment represents an amount of quadrature current that achieves a particular amount of adjustment to the reactive power flow to/from the battery 122 and/or inverter output 125 to increase the difference between the estimated frequency of the grid voltage and the nominal grid frequency (e.g., task 210) when in an islanded condition. In one exemplary embodiment, the anti-islanding modulation block 420 calculates or otherwise determines a frequency component of the reactive power adjustment term using the equation $$I_{qr\_freq} = K_p\left(\frac{f_n - f_e}{f_n}\right),$$

where $f_n$ represents the nominal frequency (e.g., 60 Hz), $f_e$ represents the measured frequency (e.g., from output 330), $K_P$ represents a gain coefficient to convert the per-unit frequency error to a desired amount of reactive power adjustment. For example, in one embodiment, the gain coefficient is chosen to be equal to 3 to provide a reactive power adjustment corresponding to three times the percentage frequency error (e.g., an adjustment in commanded reactive power by 0.15% for a 0.05% frequency error). At the same time, the gain coefficient is chosen to ensure that amount of frequency error introduced by the reactive power adjustment can be compensated by the electrical grid 104 and/or utility 105 before the grid frequency violates any applicable thresholds when the microgrid system 102 is not in an islanded state, thereby reducing the likelihood of false positives.

In exemplary embodiments, the anti-islanding modulation block 420 dynamically calculates or otherwise determines the reactive power adjustment by alternately adding or subtracting an offset amount to/from the VAR command component. In this regard, the amount of the offset may correspond to an amount of change in the reactive power flow required to produce an observable change in the estimated frequency at the grid interface 108 based on the resonant frequency of the microgrid system 102 when it is islanded. For example, to produce a 0.05% change in the frequency for a parallel-resonant load with 250 kVAR of capacitance and 250 kVAR of inductance with a 250 kW rated inverter 124 and a 60 Hz nominal frequency, the offset may be chosen to be equal to 0.25 kVAR. In exemplary embodiments, the sign for the offset amount varies over an electrical cycle, so that the offset amount is alternately added or subtracted from the frequency adjustment component. For example, the offset amount may be added to the frequency component $$\left(\text{e.g., } I_{qr\_adj} = K_p\left(\frac{f_n - f_e}{f_n}\right) + \text{Offset}\right)$$

during one electrical cycle (e.g., $0<\theta<\pi$) and subtracted from the frequency component during the next electrical cycle $$\left(\text{e.g., } I_{qr\_adj} = K_p\left(\frac{f_n - f_e}{f_n}\right) - \text{Offset}\right).$$

In this manner, the anti-islanding modulation block 420 dithers or otherwise modulates the reactive power flow to account for loads that are resonant at the nominal frequency. In exemplary embodiments, the anti-islanding modulation block 420 converts the modulated reactive power adjustment into a corresponding quadrature current adjustment that is combined with the quadrature current command at summation block 422, resulting in an adjusted quadrature current command input to the quadrature current regulator 408. Accordingly, quadrature current regulator 408 attempts to adjust the reactive power flow to increase the difference between the estimated frequency and the nominal frequency, which is counteracted or otherwise mitigated by the frequency regulation provided by the utility 105 when the electrical grid 104 is energized and connected to the grid interface 108. Conversely, when the electrical grid 104 is not being energized or regulated by the utility 105, the modulated reactive power adjustment increases the difference between the current frequency at the grid interface 108 (e.g., estimated frequency at output 330) and the nominal frequency until eventually driving the frequency to a minimum or maximum frequency limit.

Referring again to FIG. 2, in response to determining an estimated grid frequency outside the range of acceptable values (e.g., less than or equal to a minimum frequency threshold or greater than or equal to a maximum frequency threshold), the islanding detection process 200 detects or otherwise identifies an unintentional islanding condition and initiates or otherwise performs one or more remedial actions (task 214). For example, in response to detecting an unintentional islanding condition, the control module 120 may command, signal, or otherwise operate the connection arrangement 106 to disconnect the microgrid system 102 from the utility grid 104 or it may command the power inverter 124 to disable or deactivate switching. In exemplary embodiments, after disconnecting the microgrid system 102 from the grid 104, the control module 120 operates the inverter 124 to deliver power to the grid interface 108 in a manner that emulates the utility 105 to support maintaining normal operation of the microgrid system 102 in an islanded state (e.g., as an UPS). That said, in some embodiments, the control module 120 may deactivate or otherwise disable operation of the inverter 124 in response to detecting an islanding condition. The control module 120 may maintain the microgrid system 102 in the islanded state until detecting the presence of the utility 105 via sensing arrangements 115 upstream of the connection arrangement 106 or otherwise receiving signals indicative of a desire to close the connection arrangement 106 to reconnect to the grid 104.

To briefly summarize, the subject matter described herein allows for unintentional islanding conditions to be detected more reliably by reducing the likelihood of false negatives while also reducing the likelihood of false positives by maintaining the reactive power flow adjustments within a range or rate of adjustment that can be corrected by the utility grid when the microgrid system is not islanded. At the same time, by virtue of a relatively fast and accurate frequency estimate which may be updated upon every sampling or iteration of the control scheme, the reactive power adjustments in the desired direction away from the reference frequency can be implemented on-the-fly in real-time without delay, thereby allowing an unintentional islanding condition to be detected relatively quickly as the reactive power flow adjustments increasingly drive the frequency away from the reference in an islanded state.

For the sake of brevity, conventional techniques related to three-phase electrical systems, electrical energy generation and distribution, smart grids, microgrids, circuit breakers, electromechanical switches, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

The foregoing description may refer to elements or components or features being "coupled" together. As used herein, unless expressly stated otherwise, "coupled" means that one element/node/feature is directly or indirectly joined to (or directly or indirectly communicates with) another element/node/feature, and not necessarily mechanically. Thus, although the drawings may depict one exemplary arrangement of elements with direct electrical connections, additional intervening elements, devices, features, or components may be present in an embodiment of the depicted subject matter. In addition, certain terminology may also be used in the following description for the purpose of reference only, and thus are not intended to be limiting. For example, the terms "first," "second," and other such numerical terms referring to structures do not imply a sequence or order unless clearly indicated by the context.

The foregoing detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any theory presented in the preceding background, brief summary, or the detailed description.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the subject matter in any way. Rather, the foregoing detailed description will provide those skilled in the art with a convenient road map for implementing an exemplary embodiment of the subject matter. It should be understood that various changes may be made in the function and arrangement of elements described in an exemplary embodiment without departing from the scope of the subject matter as set forth in the appended claims. Accordingly, details of the exemplary embodiments or other limitations described above should not be read into the claims absent a clear intention to the contrary.

What is claimed is:

1. An electrical system comprising:
   a sensing arrangement coupled to an electrical grid interface node to measure an electrical characteristic of the electrical grid interface node;
   a connection arrangement coupled electrically in series between the electrical grid interface node and an electrical grid;
   a power conversion module having an output coupled to the electrical grid interface node; and
   a control module coupled to the sensing arrangement, the connection arrangement and the power conversion module to:
   determine an estimated frequency of the electrical characteristic based on a measured value of the electrical characteristic from the sensing arrangement;
   determine a reactive power adjustment to increase a difference between the estimated frequency and a reference frequency based on the difference between the estimated frequency and the reference frequency;
   dither the reactive power adjustment by alternately adding or subtracting an offset to obtain a modulated reactive power adjustment;
   adjust a commanded reactive power for the power conversion module by the modulated reactive power adjustment, resulting in an adjusted reactive power command;
   operate the power conversion module in accordance with the adjusted reactive power command; and
   thereafter operate the connection arrangement to electrically disconnect the electrical grid interface node from the electrical grid when the difference between the estimated frequency and the reference frequency exceeds a threshold amount.

2. The electrical system of claim 1, further comprising an energy storage element, the power conversion module being coupled between the energy storage element and the electrical grid interface node, wherein the adjusted reactive power command increases reactive power flow from the electrical grid interface node when the estimated frequency is less than the reference frequency.

3. The electrical system of claim 1, further comprising an energy storage element, the power conversion module being coupled between the energy storage element and the electrical grid interface node, wherein the adjusted reactive power command increases reactive power flow from the energy storage element to the electrical grid interface node when the estimated frequency is greater than the reference frequency.

4. The electrical system of claim 1, wherein the control module adds the modulated reactive power adjustment to the commanded reactive power to obtain the adjusted reactive power command.

5. The electrical system of claim 1, wherein:
the adjusted reactive power command comprises an adjusted quadrature current command; and
the control module operates the power conversion module in a current-source operating mode in accordance with the adjusted quadrature current command.

6. An electrical system comprising:
one or more voltage sensing arrangements coupled to an electrical grid interface node to obtain a recent voltage measurement of a voltage at the electrical grid interface node;
a connection arrangement coupled electrically in series between the electrical grid interface node and an electrical grid; and
an energy storage system comprising:
a battery;
an inverter module coupled between the battery and the electrical grid interface node, the inverter module having an output coupled to the electrical grid interface node; and
a control module coupled to the one or more voltage sensing arrangements and the inverter module to:
determine an estimated frequency of the voltage at the electrical grid interface node based on the recent voltage measurement;
determine a reactive power adjustment to increase a difference between the estimated frequency and a reference frequency based on the difference between the estimated frequency and the reference frequency;
dither the reactive power adjustment by alternately adding or subtracting an offset to obtain a modulated reactive power adjustment;
operate the inverter module to adjust reactive power flow at the output in accordance with the modulated reactive power adjustment;
operate the connection arrangement to electrically disconnect the electrical grid interface node from the electrical grid when the estimated frequency violates a frequency threshold.

7. The electrical system of claim 6, wherein the control module operates the inverter module to increase reactive power flow to the output from the electrical grid interface node when the estimated frequency is less than the reference frequency and initiates the remedial action when the estimated frequency is less than a minimum frequency threshold.

8. The electrical system of claim 6, wherein the control module operates the inverter module to increase reactive power flow from the output to the electrical grid interface node when the estimated frequency is greater than the reference frequency and initiates the remedial action when the estimated frequency is greater than a maximum frequency threshold.

9. A method of operating an electrical system to detect an islanding condition associated with an interface with an electrical grid, the method comprising:
obtaining, via one or more sensing arrangement coupled to the interface, a measurement of an electrical characteristic at the interface;
determining an estimated frequency of the electrical characteristic based on the measurement;
determining a reactive power adjustment to increase a difference between the estimated frequency and a reference frequency based on the difference between the estimated frequency and the reference frequency;
dithering the reactive power adjustment by alternately adding or subtracting an offset to obtain a modulated reactive power adjustment;
adjusting a reactive power command for the power conversion module using the modulated reactive power adjustment to obtain an adjusted reactive power command;
operating a power conversion module coupled between the interface and an energy storage element in accordance with the adjusted reactive power command to increase the difference between the estimated frequency and the reference frequency;
detecting the islanding condition when the estimated frequency violates a frequency threshold; and
operating a connection arrangement to disconnect the interface from the electrical grid in response to the islanding condition, wherein the connection arrangement is coupled electrically in series between the interface and the electrical grid.

10. The method of claim 9, wherein operating the power conversion module to increase the difference between the estimated frequency and the reference frequency comprises increasing reactive power flow to the power conversion module from the interface when the estimated frequency is less than the reference frequency.

11. The method of claim 9, wherein operating the power conversion module to increase the difference between the estimated frequency and the reference frequency comprises increasing reactive power flow to the interface from the power conversion module when the estimated frequency is greater than the reference frequency.

12. The method of claim 9, wherein operating the power conversion module to increase the difference between the estimated frequency and the reference frequency comprises:
operating the power conversion module to supply reactive power when the estimated frequency is greater than the reference frequency; and
operating the power conversion module to consume reactive power when the estimated frequency is less than the reference frequency.

13. The method of claim 9, wherein dithering the reactive power adjustment comprises varying a sign for the offset over an electrical cycle.

14. The electrical system of claim 13, wherein the offset is added during the electrical cycle between 0 and $\pi$.

15. The method of claim 9, wherein dithering the reactive power adjustment comprises adding the offset during an electrical cycle between 0 and $\pi$.

16. The method of claim 9, wherein adjusting the reactive power command comprises:
- converting the modulated reactive power adjustment to a quadrature current adjustment; and
- combining the quadrature current adjustment with a quadrature current command to obtain an adjusted quadrature current command input to a quadrature current regulator.

17. The method of claim 16, wherein operating the power conversion module comprises:
- determining a quadrature voltage command based on a difference between the adjusted quadrature current command and a measured direct current at the interface; and
- operating the power conversion module to achieve a reactive power flow corresponding to the quadrature voltage command.

\* \* \* \* \*